(12) United States Patent
Mora Puchalt et al.

(10) Patent No.: US 9,548,948 B2
(45) Date of Patent: Jan. 17, 2017

(54) INPUT CURRENT CANCELLATION SCHEME FOR FAST CHANNEL SWITCHING SYSTEMS

(71) Applicant: Analog Devices Global, Hamilton (BM)

(72) Inventors: Gerard Mora Puchalt, Valencia (ES); Bhargav R. Vyas, Bangalore (IN); Adrian W. Sherry, Raheen (IE); Arvind Madan, Bangalore (IN)

(73) Assignee: Analog Devices Global, Hamilton (BM)

( * ) Notice: Subject to any disclaimer, the term of this patent is extended or adjusted under 35 U.S.C. 154(b) by 683 days.

(21) Appl. No.: 13/963,260

(22) Filed: Aug. 9, 2013

(65) Prior Publication Data

US 2014/0079079 A1   Mar. 20, 2014

Related U.S. Application Data

(60) Provisional application No. 61/692,855, filed on Aug. 24, 2012, provisional application No. 61/793,932, filed on Mar. 15, 2013.

(51) Int. Cl.
  *H04L 12/931*  (2013.01)
  *H03K 17/00*  (2006.01)
  *H03M 1/12*  (2006.01)

(52) U.S. Cl.
  CPC .......... *H04L 49/405* (2013.01); *H03M 1/124* (2013.01); *H03M 1/1225* (2013.01)

(58) Field of Classification Search
  CPC ..... H04L 49/405; H03M 1/124; H03M 1/1225
  See application file for complete search history.

(56) References Cited

U.S. PATENT DOCUMENTS

| | | | | |
|---|---|---|---|---|
| 6,600,355 B1* | 7/2003 | Nguyen | ................... | G06F 1/08 327/149 |
| 6,774,700 B1* | 8/2004 | Wood | ................. | H04L 25/0276 327/108 |
| 6,975,145 B1* | 12/2005 | Vadi | ........................ | G06F 1/04 327/298 |
| 7,362,134 B2* | 4/2008 | Bajkowski | ............. | G11C 29/56 326/104 |
| 2005/0162192 A1* | 7/2005 | Rhee | ................ | H03K 17/04106 326/113 |

FOREIGN PATENT DOCUMENTS

| | | |
|---|---|---|
| CN | 103701463 A | 4/2014 |
| DE | 102013109072 A1 | 5/2014 |

OTHER PUBLICATIONS

"Germany Application Serial No. 102013109072.9, Office Action mailed Jan. 22, 2014".

* cited by examiner

*Primary Examiner* — Kenneth B Wells
(74) *Attorney, Agent, or Firm* — Schwegman Lundberg & Woessner, P.A.

(57) ABSTRACT

A multichannel system, including a multiplexer having inputs for a plurality of input channels, and a pre-charge buffer having a plurality of inputs coupled to an input of the multiplexer, and an output coupled to a multiplexer output. The multichannel system may stand alone, or may be coupled to a receiving circuit having an input coupled to an output of the multiplexer. In some instances, the receiving circuit is an analog to digital converter.

26 Claims, 12 Drawing Sheets

INPUT CURRENT CANCELLATION SCHEME FOR FAST CHANNEL SWITCHING SYSTEMS

RELATED APPLICATIONS

This application claims the benefit of U.S. Provisional Patent Application Nos. 61/692,855, filed on Aug. 24, 2012, and 61/793,932, filed on Mar. 15, 2013, both of which are incorporated herein by reference.

BACKGROUND OF THE INVENTION

The present invention relates to fast channel switching systems, and more particularly, to an input current cancellation scheme in fast channel switching systems.

As electronic systems continue to grow in complexity, many devices, such as communication and medical equipment, simultaneously receive and process data signals originating from multiple data channels. For example, advanced communication protocols, such as Long Term Evolution (LTE), make use of multiple antennas to implement multiple input multiple output (MIMO) techniques on both mobile devices and base stations to achieve increased data rates. In such MIMO systems, multiple signals can be received and processed in parallel. In another example, medical devices, such as ultrasound, process data from multiple sensors to generate a single output, such as an image.

As can be expected, the analog to digital converter (ADC) a fundamental component of these electronic devices. Referring to the examples above, the ADC typically receives analog signals from a signal source (e.g., an antenna or a sensor), which are then converted by the ADC to a digital code representing the data. Accordingly, in multichannel receivers, each parallel analog signal is typically processed by one or more ADCs to produce an output digital signal. To convert multichannel analog signals to digital form, several circuit architectures have been developed.

In a related art approach, a separate ADC is included for each input channel. In addition to the high component cost associated with including an ADC on each channel, the power consumption of this arrangement is also significantly increased.

In another related art approach, a front-end multiplexer is employed such that each input channel is coupled to the front-end multiplexer, and the output of the multiplexer is relayed to the ADC and the rest of the circuitry in the chain. A drawback of this scheme is that it draws considerable input current from the input driver which becomes a concern as the speed of the switching increases. In addition, capacitance on the output of the multiplexer can cause input currents when switching channels.

To increase the switching speed of ADCs, input buffers can be used to charge an ADC input capacitor in order to reduce residual input current. Residual input current has undesirable effects including undesired gain, offset, and nonlinearity issues. The input buffer may have an offset that can be cancelled out by using a chopping mechanism. These techniques, however, reduce the accuracy of the ADC's output.

In yet another related art approach, the multiplexer output and the ADC input are decoupled and an external buffer is disposed at the front-end of the ADC. Here, the capacitance on the output side of the multiplexer can be particularly high (i.e., compared to internal loads) which results in high input currents at fast channel-switching rates.

As related art techniques either have high power consumption or low switching rates, the inventors perceive a need for a multichannel system that overcomes the above-identified drawbacks of existing systems.

DETAILED DESCRIPTION OF THE INVENTION

Embodiments of the present invention provide an input current cancellation scheme for fast channel switching systems that includes a multichannel system, including a multiplexer having inputs for a plurality of input channels, a receiving circuit having an input coupled to an output of the multiplexer, and a pre-charge buffer having inputs, each coupled to an input of the multiplexer, and an output coupled to the output of the multiplexer.

FIG. 1(a) illustrates a multichannel conversion system 100 according to an embodiment of the present invention. The conversion system 100 may include an ADC 110, a multiplexer 120, a pre-charge buffer 130, and a controller 140. The conversion system 100 may be coupled to a plurality of signal sources $A_{IN0}$-$A_{INn}$, called "channels" herein. Although not shown, the ADC 110 may be coupled to additional circuitry at its output, such as a digital signal processor.

As shown in FIG. 1(a), the multiplexer 120 may have a plurality of inputs, each coupled to a respective input channel $A_{IN0}$ to $A_{INn}$. The multiplexer 120 may have an output coupled to an input of the ADC 110. The pre-charge buffer 130 also may have a plurality of inputs coupled to a respective input channel $A_{IN0}$ to $A_{INn}$ and an output coupled to the output of the multiplexer 120. The pre-charge buffer 130 may be provided as a unity gain amplifier. The multiplexer 120 and pre-charge buffer 130 may have control inputs coupled to the controller 140. The controller 140 may control operation of the multiplexer 120 and pre-charge buffer 130 according a protocol and timing scheme provided, for example, by a driving clock (not shown).

During operation, the converter system 100 may propagate input signals from the channels $A_{IN0}$ to $A_{INn}$ to the ADC 110 on a cyclical basis. On each cycle, the converter system 100 may operate in a precharge phase and a signal driving phase. During the precharge phase, the pre-charge buffer 130 may output a voltage to the input of the ADC 110 based on a voltage present at an associated input channel (e.g., channel $A_{IN1}$). During the signal driving phase, the pre-charge buffer 130 may be disabled and the multiplexer 120 may propagate a signal from the input channel $A_{IN0}$ to the ADC 110. Thereafter, the converter system 100 may advance to another channel (e.g., $A_{IN2}$) for another cycle of operation.

Figures 8A, 8B:
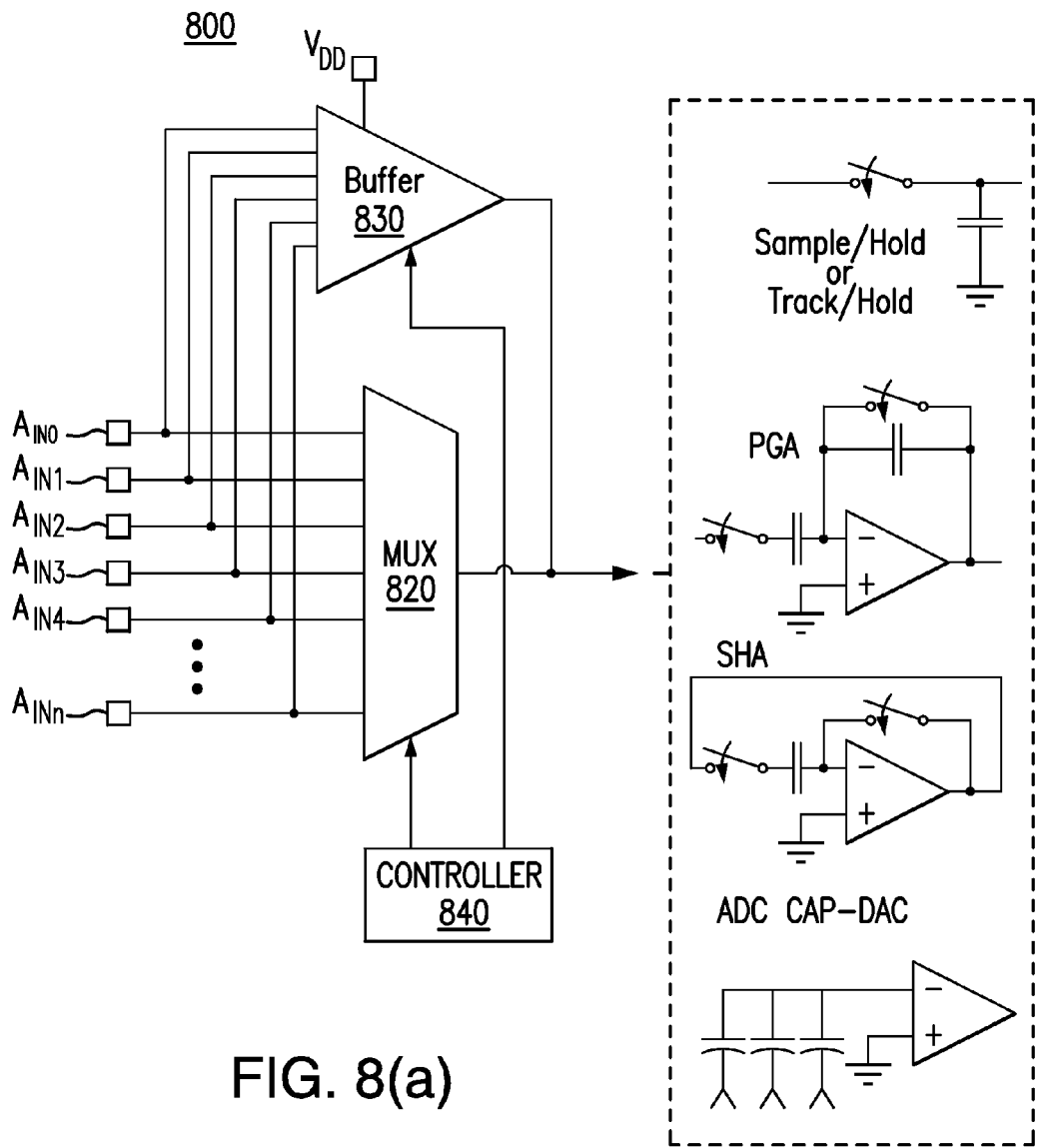
FIGS. 8(a) and 8(b) illustrate respectively a pre-charge circuit 800 according to an example embodiment of the present invention, and exemplary circuits capable of being driven by the pre-charge circuit.

Although FIG. 1(a) illustrates a multichannel conversion system 100 having an ADC 110, the pre-charge components including a multiplexer 120, a pre-charge buffer 130, and a controller 140 can be applied in advance of circuits other than an ADC 110. For example, FIG. 8(a) illustrates a pre-charge circuit 800 according to an example embodiment of the present invention. FIG. 8(b) illustrates some (non-exhaustive) example circuits that can be driven by the pre-charge circuit 800 including a tracking or sampling circuit, a programmable gain amplifier (PGA), and various types of ADCs or DACs. In addition, the configuration in FIG. 1(a) is an example, and other configurations are feasible.

FIG. 1(b) represents operation of the converter system 100 according to an embodiment of the present invention. In particular, FIG. 1(b) illustrates exemplary control signals that may be output from the controller 140 to the multiplexer 120 and pre-charge buffer 130 of FIG. 1(a). At time $t_0$, FIG. 1(b) illustrates control signals output from the controller 140 to the multiplexer 120 to propagate signals from a channel i to the ADC 110. At time $t_1$, the controller 140 may disable the multiplexer 120 from propagating any input signals to the ADC 110 and may enable the pre-charge buffer 130. Specifically, the controller 140 may cause the pre-charge buffer 130 to output signals representing the input signal present at channel i+1. At time $t_2$, FIG. 1(b) illustrates the pre-charge buffer 130 being disabled and the multiplexer 120 being enabled to propagate input signals from the channel i+1 to the ADC 110. The multiplexer 120 may remain enabled until time $t_3$, when the controller 140 may disable the multiplexer 120 and enable the pre-charge buffer 130 at another channel (e.g., channel i+2).

Use of a pre-charge buffer 130 may provide an input current cancellation scheme to a converter system 100. The pre-charge buffer 130 may have a high impedance input, which reduces an amount of current that needs to be supplied by the input channels $A_{IN0}$ to $A_{INn}$ to charge an input node of the ADC 110 to desired voltages. Instead, voltage supplies of the pre-charge buffer 130 may drive the input terminal of the ADC 110. Although the pre-charge buffer 130 ordinarily might introduce some kind of voltage error due to offsets or other non-ideal circuit behavior, such effects may be reduced by connecting the input channels $A_{IN0}$ to $A_{INn}$ to the ADC input via the multiplexer 120 prior to conversion. Thus, in effect, the pre-charge buffer 130 may pre-charge the ADC input to a desired voltage with coarse precision and the input channel itself (e.g., $A_{IN1}$) may refine the pre-charge voltage thereafter by direct connection through the multiplexer 120. In addition, the multiplexer 120 and the interconnect to the receiving ADC 110 may have a capacitive load that may be pre-charged to prevent currents during channel switching.

As indicated, the pre-charge buffer 130 may be provided as a unity gain amplifier. For example, it may be an operational amplifier or an operational trans-conductance amplifier ("OTA"). According to this example embodiment, an OTA can be selected as a pre-charge buffer 130 because an OTA only drives a capacitive load. As a result, current consumption of the buffer's output stage can be reduced.

Each of the input channels $A_{IN0}$ to $A_{INn}$ can be multiplexed sequentially or in other desired orders. The controller 140 can instruct multiplexer 120 to select one or more input channels $A_{IN0}$ to $A_{INn}$. Alternatively, the order of inputs to the ADC 110 can be determined by a programmable register (not shown). In an embodiment, the controller 140 may include a state machine driven by an external clock (also not shown).

An example implementation of a multichannel converter system 100 will now be described. In this example, the converter system 100 can achieve a channel scan rate of 50 kHz. The input voltage may range from 0V to 5.5V. In addition, if the ADC 110 has an input capacitance in the order of ~8 pF and is configured to switch between two channels for 20 μs each, then the average input current resulting from the maximum difference between $A_{INn}$ and $A_{INn+1}$ can be:

$$I_{In\_SingleChannel} = C^*V^*F/N_{Channels} = 8\ pF^*5.5V^*50\ KHz/2 = 1.1\ \mu A$$

Figure 1:
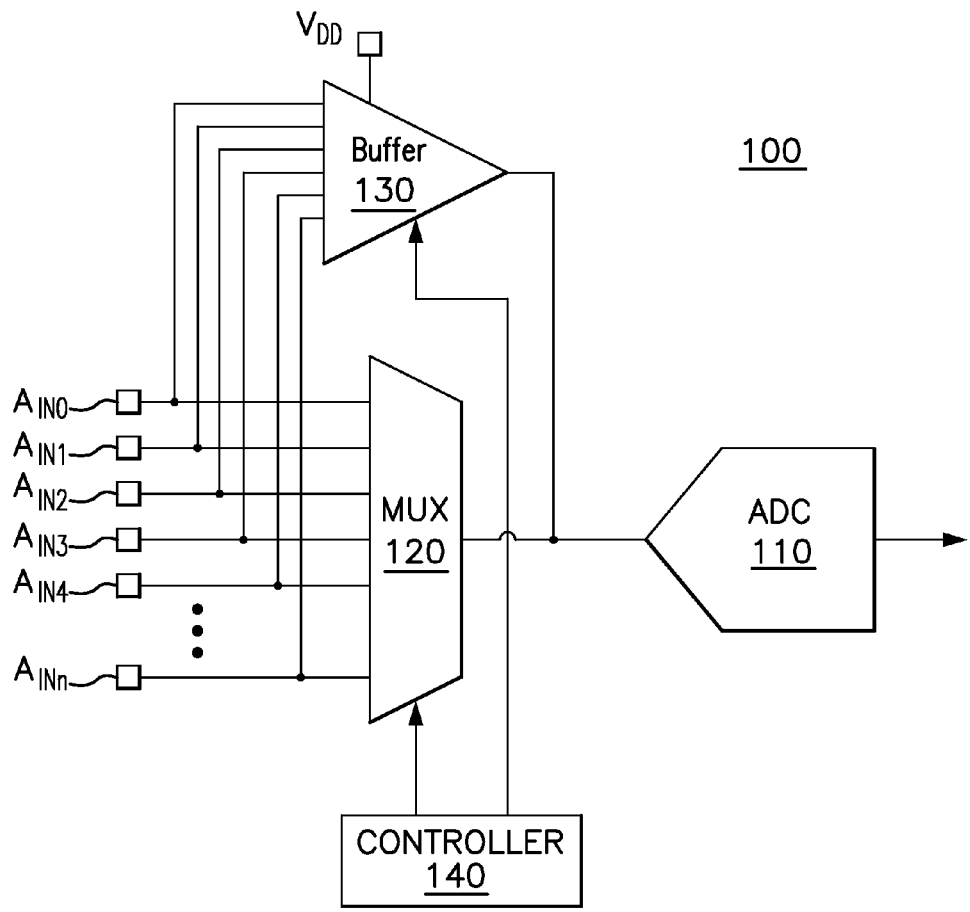
FIGS. 1(a) and 1(b) illustrate respectively a multichannel conversion system according to an example embodiment of the present invention, and its operation.
Figure 1:
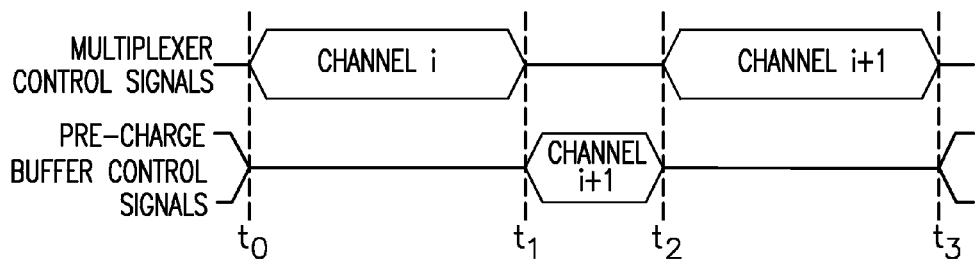

The configuration of FIG. 1 provides a conversion system 100 with fast pre-charge in an area-efficient configuration. The pre-charge buffer 130 may be shared among all input channels $A_{IN0}$ to $A_{INn}$, which may contribute to a reduced-sized circuit and power-efficiency when the system 100 is manufactured as an integrated circuit. Within the pre-charge buffer 130, the buffer 130 may include input switches (not shown in FIG. 1) to govern connectivity to the input channels $A_{IN0}$ to $A_{INn}$ but, otherwise, other components of the pre-charge buffer 130 may be shared. Other embodiments, however, may have different architectures for the pre-charge buffer.

Figure 2:
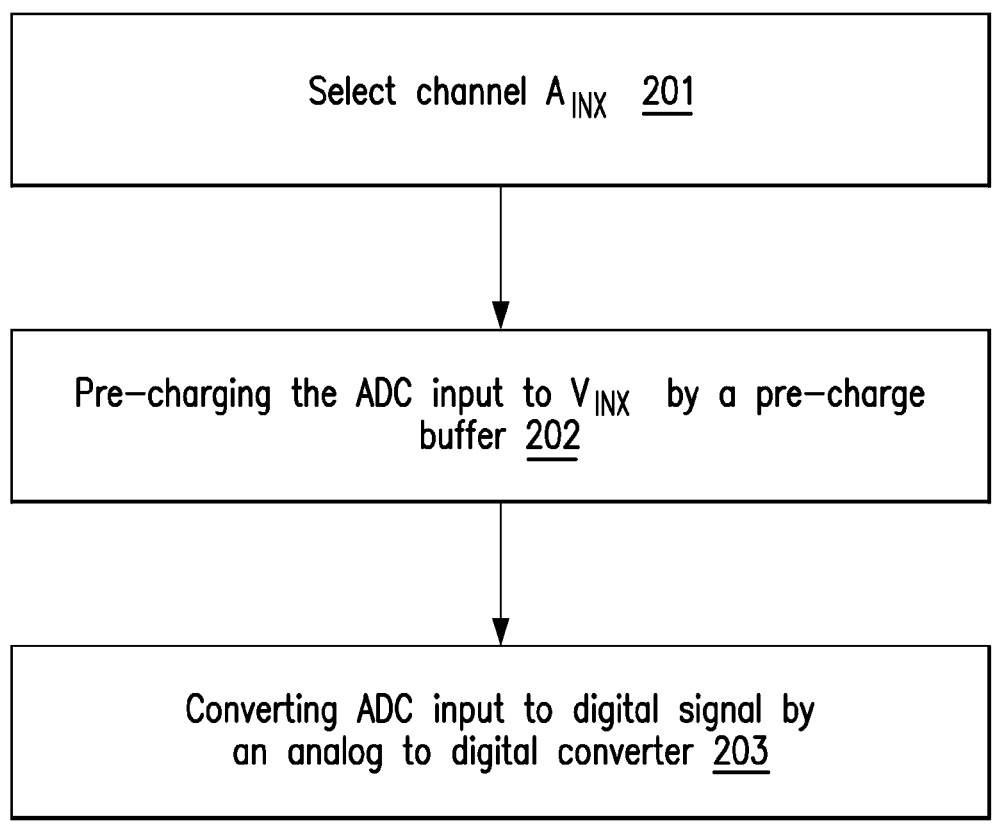
FIG. 2 illustrates a multichannel conversion method according to an example embodiment of the present invention.

FIG. 2 illustrates a multichannel conversion method 200 according to an example embodiment of the present invention. In describing the method of FIG. 2, reference will also be made to the elements of the example multichannel conversion system of FIG. 2, but the method may also be applied to other multichannel conversion systems.

At 201, the multiplexer 120 selects one of a plurality of analog input channels $A_{IN0}$ to $A_{INn}$ (e.g., $A_{INX}$)—The analog input channels $A_{IN0}$ to $A_{INn}$ can be multiplexed sequentially or in a predetermined order, as determined by controller 140. As described above, the plurality of input channels $A_{IN0}$ to $A_{INn}$ may correspond to input signals received from communication, medical, or other electronic devices.

At 202, pre-charge buffer 130 charges the input node of ADC 110 to a pre-charge voltage $V_{INX}$ corresponding to the selected input $A_{INX}$. The pre-charge buffer 130 charges the input node to a next channel input voltage after the analog to digital conversion of a previous channel is completed and before switching to the next channel.

At 203, ADC 110 converts the selected input $A_{INX}$ to at least one digital signal. For example, the ADC 110 may be directly coupled to multiplexer 120. In this example configuration, the input node of the ADC 110 is the same as the output node of the multiplexer 120. The conversion method 200 may iterate through a plurality of analog input channels $A_{IN0}$ to $A_{INn}$, as desired.

Figure 3:
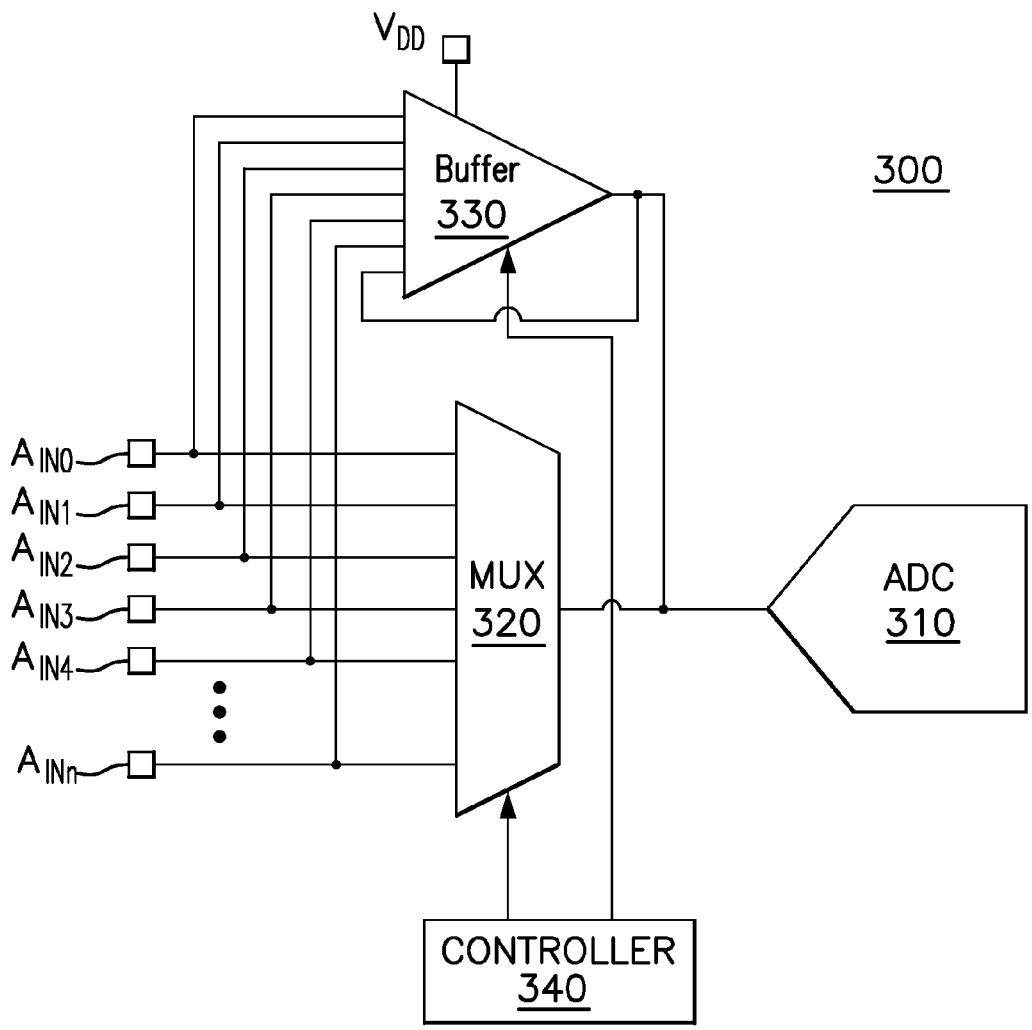
FIG. 3 illustrates a multichannel conversion system according to another example embodiment of the present invention.

FIG. 3 illustrates a multichannel conversion system 300 according to another embodiment of the present invention. The conversion system 300 may include an ADC 310, a multiplexer 320, a pre-charge buffer 330, and a controller 340. The conversion system 300 may be coupled to a plurality of input channels. Although not shown, the ADC 310 may be coupled to additional circuitry at its output, such as a digital signal processor.

As shown in FIG. 3, the multiplexer 320 may have a plurality of inputs, each coupled to a respective input channel $A_{IN0}$ to $A_{INn}$. The multiplexer 320 may have an output coupled to an input of the ADC 310. The pre-charge buffer 330 also may have a plurality of inputs, each coupled to a respective input channel $A_{IN0}$ to $A_{INn}$, and an input for a feedback signal. The output of the pre-charge buffer 330 can be coupled to the output of the multiplexer 320. The multiplexer 320 and pre-charge buffer 330 may have control inputs coupled to the controller 340. The controller 340 may control operation of the multiplexer 320 and pre-charge buffer 330 according a protocol and timing scheme provided, for example, by a driving clock (not shown).

During operation, the converter system 300 may propagate input signals from the channels $A_{IN0}$ to $A_{INn}$ to the ADC 310 on a cyclical basis. On each cycle, the converter system 300 may operate in a precharge phase and a signal driving phase. During the precharge phase, the pre-charge buffer 330 may output a voltage to the input of the ADC 310 based on a voltage present at an associated input channel (e.g., channel $A_{IN1}$). During the signal driving phase, the pre-charge buffer 330 may be disabled and the multiplexer 320 may propagate a signal from the input channel $A_{IN1}$ to the ADC 310. Thereafter, the converter system 300 may advance to another channel (e.g., $A_{IN2}$) for another cycle of operation.

As shown in FIG. 3, the pre-charge buffer 330 of conversion system 300 may include a feedback loop. The amplifier feedback can be used to improve amplifier performance including gain stability, frequency response, and linearity. In addition, deviances caused by manufacturing variations and operating conditions can be reduced. In the embodiment of FIG. 3, pre-charge buffer 330 may have a single input for the feedback signal.

Figure 4:
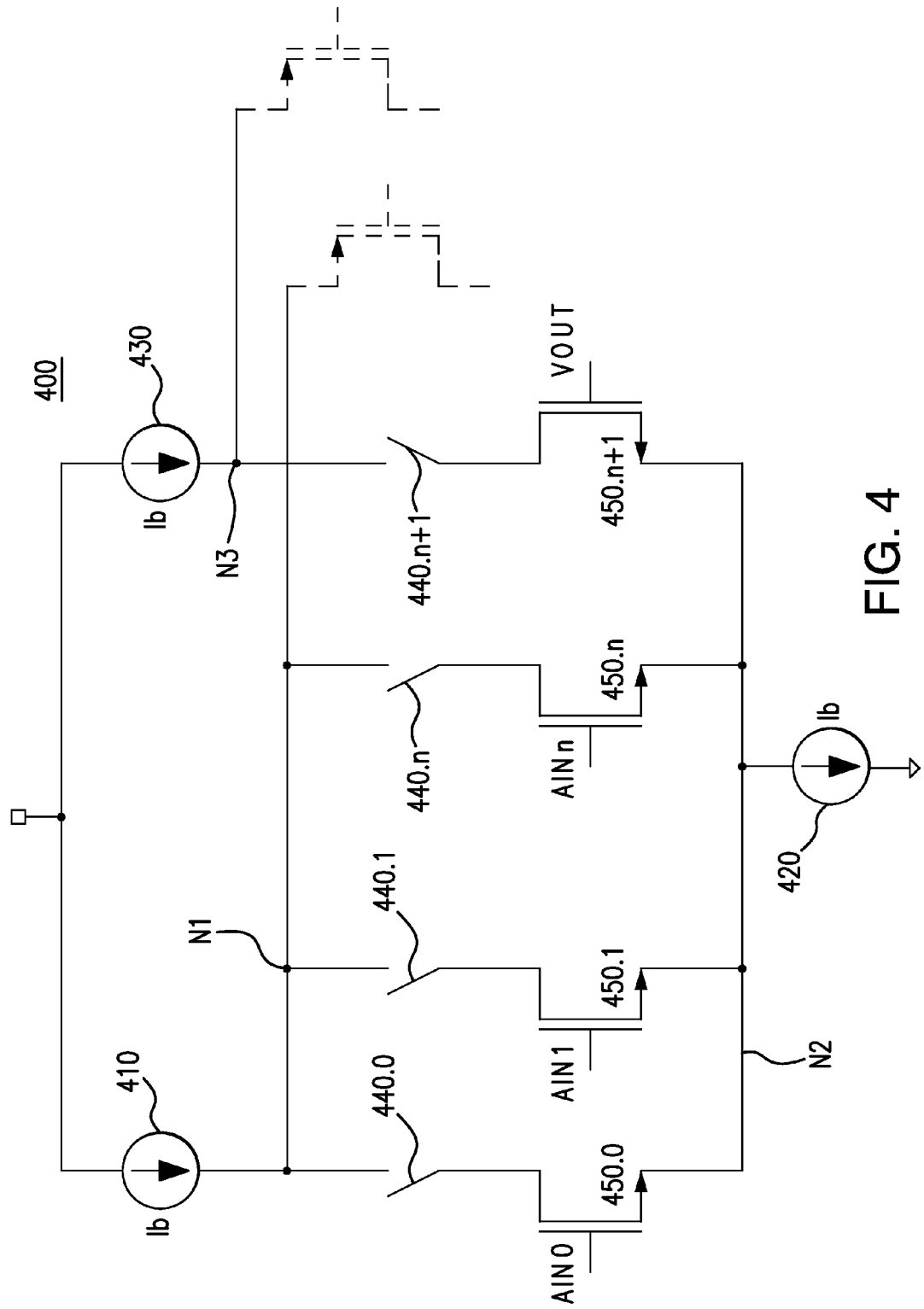
FIG. 4 is a circuit diagram of a pre-charge buffer according to an example embodiment of the present invention.

FIG. 4 is a circuit diagram of a pre-charge buffer 400 according to an embodiment of the present invention. The first stage of buffer 400 may include a plurality of current sources 410, 420, and 430, control switches 440.0-440.n+1 and input pair transistors 450.0-450.n+1. The input pair transistors 450.0-450.n may have gates coupled respectively to the input channels $A_{IN0}$-$A_{INn}$. A final input pair transistor 450.n+1 may have its gate coupled to the buffer output $V_{OUT}$. Inputs of the control switches 440.0-440.n+1 may be coupled to a controller (not shown in FIG. 4).

The input pair transistors 450.0-450.n and control switches 440.0-440.n may be provided in a paired fashion which are series connected between a pair of common nodes within the pre-charge buffer 400, shown as N1 and N2 respectively. One of the current sources 410 may be coupled to node N1 and another current source 420 may be coupled to node N2.

The first stage of pre-charge buffer 400 may include an input pair transistor 450.n+1 and control switch 440.n+1 associated with the $V_{OUT}$ signal. The transistor 450.n+1 and control switch 440.n+1 may be coupled between the second node N2 and another node N3 of the pre-charge buffer. The third current source 430 may be coupled to the node N3 as well.

During operation of a pre-charge phase, only one of the input channels (e.g., $A_{IN0}$) will be selected to be active. Control switches 440.0-440.n associated with the other input channels $A_{IN0}$-$A_{INn}$ may open, thus disabling the transistors 450.0-450.n from contributing to the pre-charge buffer's output.

The current sources 410, 430 may supply current in an amount Ib to nodes N1 and N3 respectively. The second current source 420 may drain current from the nodes N1 and N3 in an aggregate amount Ib. When the pre-charge buffer is balanced, the second current source 420 should drain current from the N1 and N3 nodes in equal amounts (½Ib), neglecting non-ideal circuit behavior. Conductance of the transistors 450.0 and 450.n+1, however, may govern the amount of current drawn through each transistor 450.0, 450.n+1, which varies based on the voltages presented at the gates of those transistors—$A_{IN0}$ and $V_{OUT}$, respectively. The remaining current may be output from the pre-charge buffer first stage 400.

Figure 5:
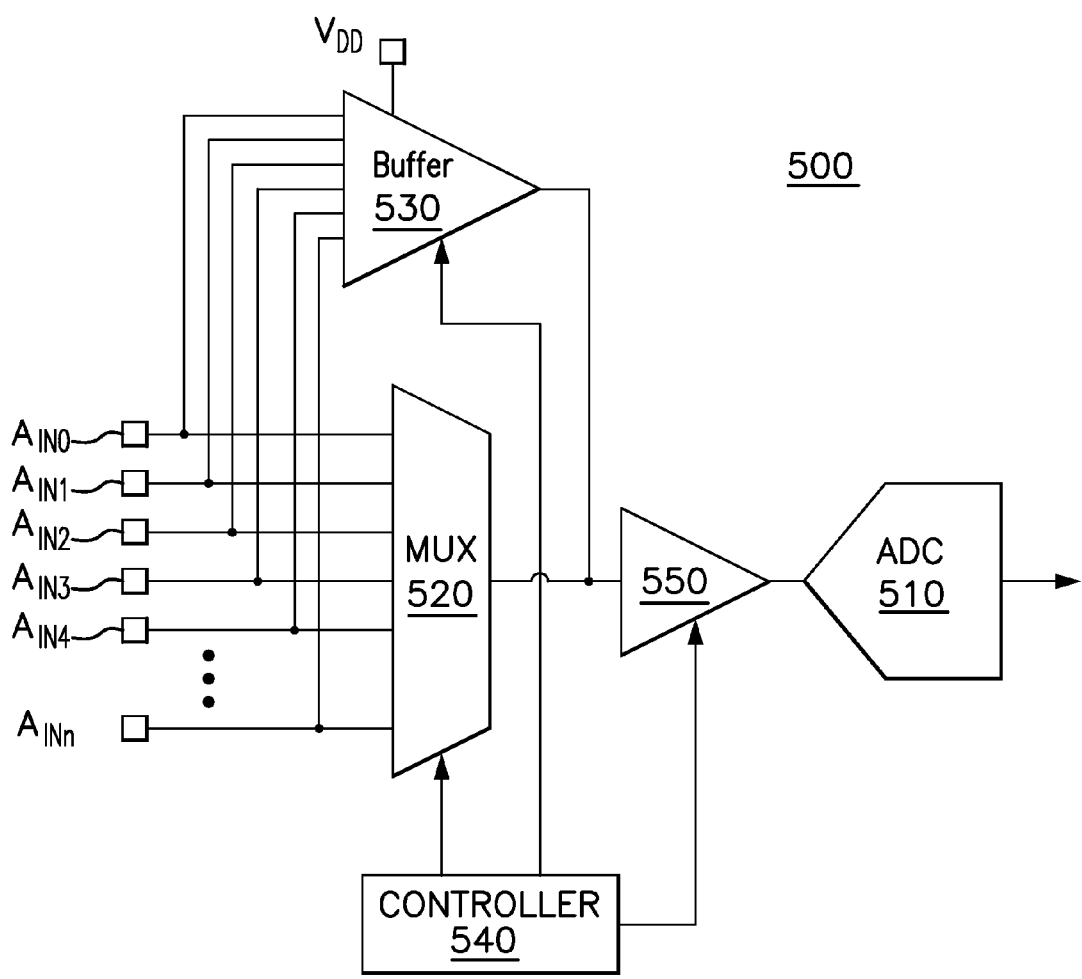
FIG. 5 illustrates a multichannel conversion system according to another example embodiment of the present invention.

FIG. 5 illustrates a multichannel conversion system 500 according to another embodiment of the present invention. The conversion system 500 may include an ADC 510, a multiplexer 520, a pre-charge buffer 530, and a controller 540. The conversion system 500 may be coupled to a plurality of input channels. Although not shown, the ADC 510 may be coupled to additional circuitry at its output, such as a digital signal processor.

As shown in FIG. 5, the multiplexer 520 may have a plurality of inputs, each coupled to a respective input channel $A_{IN0}$ to $A_{INn}$. The multiplexer 520 may have an output coupled to an input of the ADC 510 through second buffer 550. The pre-charge buffer 530 also may have a plurality of inputs, each coupled to a respective input channel $A_{IN0}$ to $A_{INn}$ and an output coupled to the output of the multiplexer 520. The multiplexer 520 and pre-charge buffer 530 may have control inputs coupled to the controller 540. The controller 540 may control operation of the multiplexer 520 and pre-charge buffer 530 according a protocol and timing scheme provided, for example, by a driving clock (not shown).

During operation, the converter system 500 may propagate input signals from the channels $A_{IN0}$ to $A_{INn}$ to the ADC 510 on a cyclical basis. On each cycle, the converter system 500 may operate in a precharge phase and a signal driving phase. During the precharge phase, the pre-charge buffer 530 may output a voltage to the input of the ADC 510 based on a voltage present at an associated input channel (e.g., channel $A_{IN1}$). During the signal driving phase, the pre-charge buffer 530 may be disabled and the multiplexer 520 may propagate a signal from the input channel $A_{IN1}$ to the ADC 510. Thereafter, the converter system 500 may advance to another channel (e.g., $A_{IN2}$) for another cycle of operation.

As shown in FIG. 5, the multichannel conversion system 500 may include a second amplifier 550. In one example, the second amplifier 550 can be a unity gain buffer. The unity gain buffer can be used to reconcile a higher impedance multiplexer 520 with lower impedance ADC 510. The interposed unity gain buffer prevents the ADC 510 from unnecessarily loading the multiplexer 520. In another example, the second amplifier 550 can be a programmable gain amplifier (PGA). In the PGA example, the amplifier is typically an operational amplifier whose gain can be controlled by an external source, such as controller 540.

Although not shown, the unity gain buffer or PGA may also include a feedback signal.

Figure 6A:
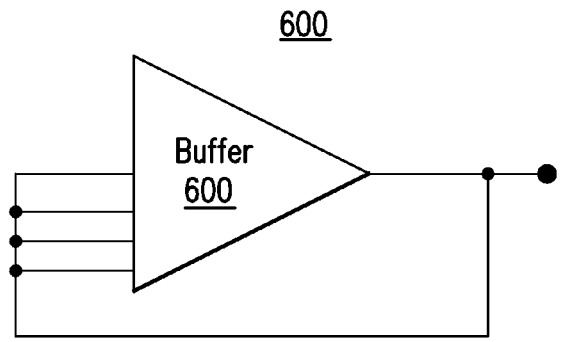
FIGS. 6(a) and 6(b) are circuit diagrams of a pre-charge buffer according to another example embodiment of the present invention.

FIG. 6(a) is a circuit diagram of a pre-charge buffer 600 according to an embodiment of the present invention. As shown in FIG. 6(a), in some instances, a feedback signal is supplied to each input pair device such that the input pair transistor connected to the next channel may be selected.

Figure 6B:
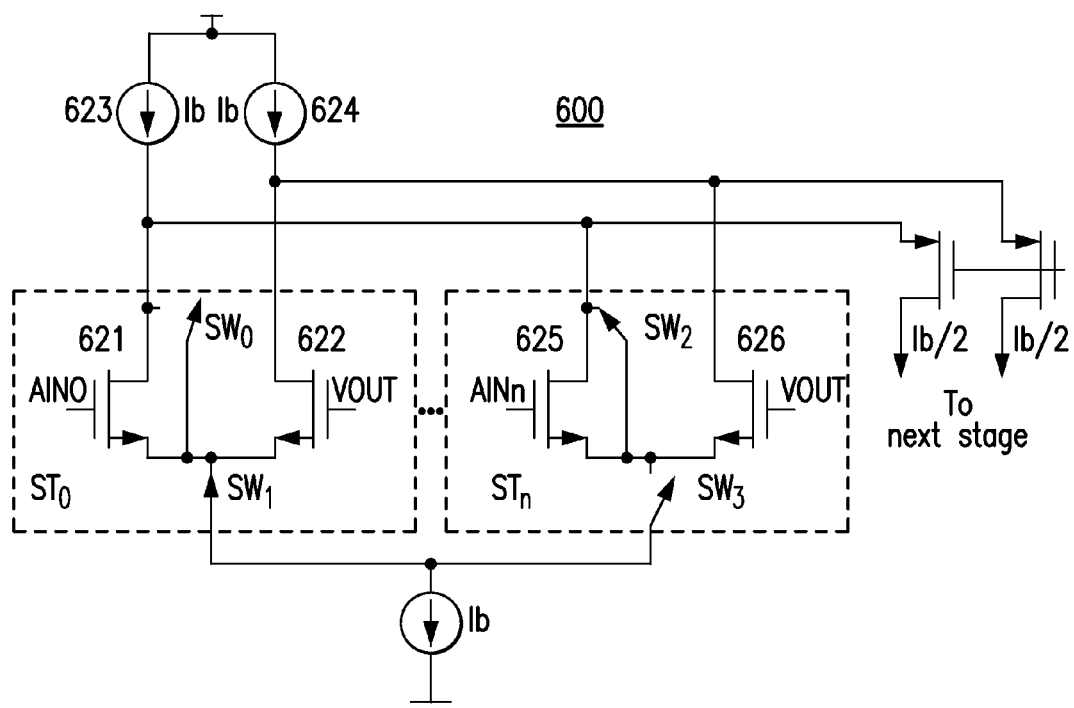

As shown in FIG. 6(b), the example pre-charge buffer 600 may include a plurality of PMOS and/or NMOS transmission gates 621 and 622 and a plurality of current sources 623 and 624.

In particular, FIG. 6(b) illustrates a group of input stages $ST_0$-$ST_n$, each input stage having a plurality of transistors 621 and 622 (or 625 and 626), each of the transistors 621 and 622 being supplied by one of the plurality of current sources 623 and 624. Corresponding P-type input stages can also be used, and are the flipped version of the N-type input stages.

In order to achieve rail-to-rail input operation, the pre-charge buffer 600 may have a combination of N-type and P-type input pairs. For most of the input voltage range, both N-type and P-type input pairs are active. But when the input voltage approaches the rails, one of the input pairs will turn off (i.e., PMOS when input voltage close to $V_{DD}$ and NMOS when close to $V_{SS}$) and the other will stay active such that the pre-charge buffer 600 can operate over the full input range.

The example pre-charge buffer 600 has different input stages for each input channel. When the pre-charge buffer 600 is active, only the input stages of the selected input channel are active. A set of switches $SW_1$ and $SW_3$ provide the bias currents only to the input stages that are active. Another set of switches $SW_0$ and $SW_2$ connect the sources of the input pair devices that are not selected to a low impedance node so as to avoid floating nodes.

Figure 7A:
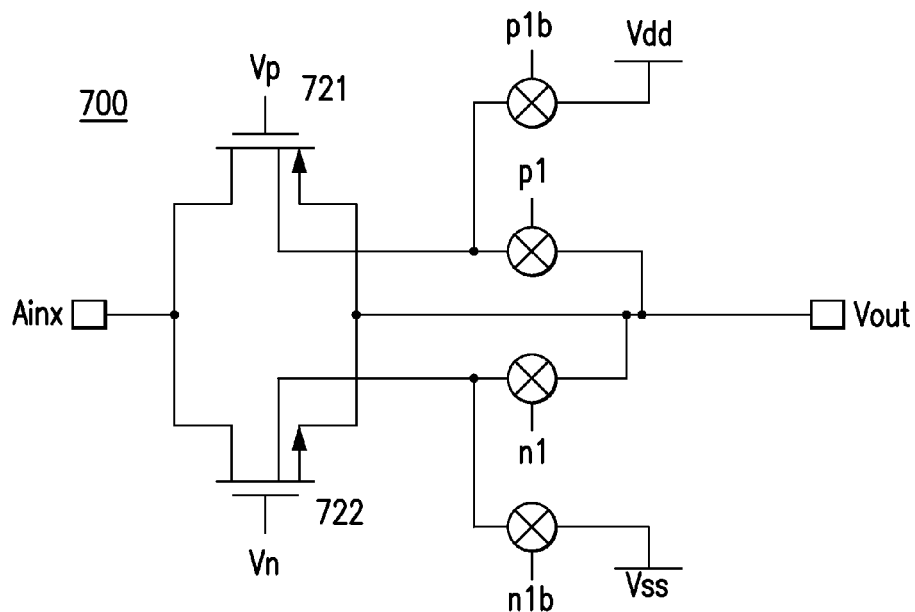
FIGS. 7(a) and 7(b) illustrate respectively a circuit diagram of multiplexer unit cell according to an example embodiment of the present invention, and a timing diagram showing the operation of the cell.

FIG. 7(a) is a circuit diagram of a unit cell 700 of a multiplexer according to an embodiment of the present invention. The cell 700 may include a pair of PMOS and/or NMOS transistors 721 and 722. Drains of the transistors 721, 722 may be connected to a respective input channel $A_{INX}$ and sources of the transistors 721, 722 may be connected to an output terminal $V_{OUT}$ of the multiplexer. The transistors 721, 722 may receive differential control signals Vp, Vn from a controller (not shown) that may cause the transistors 721, 722 to become conductive and non-conductive synchronously to each other.

During operation, the transistors 721, 722 may receive control signals Vp and Vn to render the unit cell 700 conductive when the cell is to pass a signal of input channel $A_{INX}$ to the ADC and to render the unit cell 700 non-conductive at all other times.

In an embodiment, the unit cell 700 may include a plurality of switches p1, p1b, n1 and n1b connected to backgates of the transistors 721, 722. Specifically, the NMOS transistor 721 may be coupled to the output terminal VOUT via a first switch p1 and to a VDD supply voltage via a second switch p1b. Similarly, the PMOS transistor 722 may be coupled to the output terminal VOUT via a third switch n1 and to a VSS supply voltage via a fourth switch n1b.

This example configuration offers a good trade-off between leakage and on-resistance. In order to obtain the same on-resistance, the switch size can be smaller.

Figure 7B:
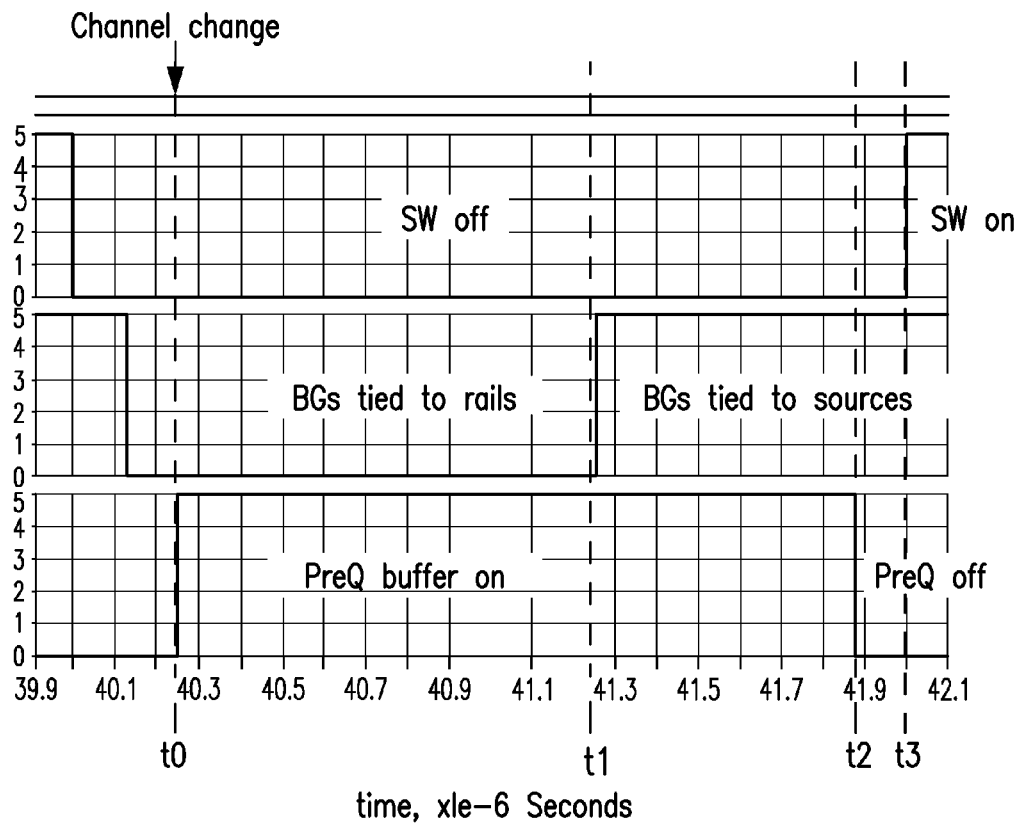

Operation of the cell 700 is presented with the timing diagram of FIG. 7(b). The unit cell 700 may be activated during a cycle of operation in which the cell 700 is to output the input channel $A_{INX}$ to the ADC. A channel change may occur from a prior unit cell ($A_{INX-1}$, not shown) to a new cell at time $t_0$. When there is a channel change, a controller may turn off a switch of a previous channel $A_{INX-1}$ by driving the gate of the NMOS to VSS and the gate of the PMOS to $V_{DD}$. Backgates of the previous channel's transistors also may be driven to the respective rails via switches p1b, n1b. And, when controller selects the input switch of a new unit cell 700 ($A_{INX}$), an associated precharge buffer (not shown) may be activated to precharge the ADC input node to the next selected channel input voltage. After a period of time, shown as $t_1$, the backgates of the next selected channel transistors 721, 722 (cell $A_{INX}$) may be connected to their sources so the precharge buffer also charges the backgates of transistors 721, 722 to the voltage of the input channel $A_{INX}$ via VOUT and switches p1, n1. When the precharge phase is completed, shown as $t_2$, the precharge buffer may be deactivated and its output becomes tri-stated. Finally the transistors 721, 722 of cell $A_{INX}$ may turned on by driving the gates of the NMOS and PMOS devices to VDD and VSS respectively.

When there is a channel change, the first step is to turn off the switch of the previous channel by driving the gate of the NMOS to $V_{SS}$ and the gate of the PMOS to $V_{DD}$. Secondly, the backgates of the previous channel switch are also driven to their respective rails. Then, when the channel selection bus selects the input switch of the next channel, the pre-charge buffer is activated to pre-charge the input node of ADC to the next selected channel input voltage. After a period of time, the backgates of the next selected channel switch are connected to their sources such that the pre-charge buffer also charges the backgates to the appropriate voltage. Upon completion of the pre-charge phase, the pre-charge buffer is deactivated and its output becomes triestated. Lastly, the next channel switch is turned on by driving the gates of the NMOS and PMOS devices to $V_{DD}$ and $V_{SS}$ respectively.

Figure 9A:
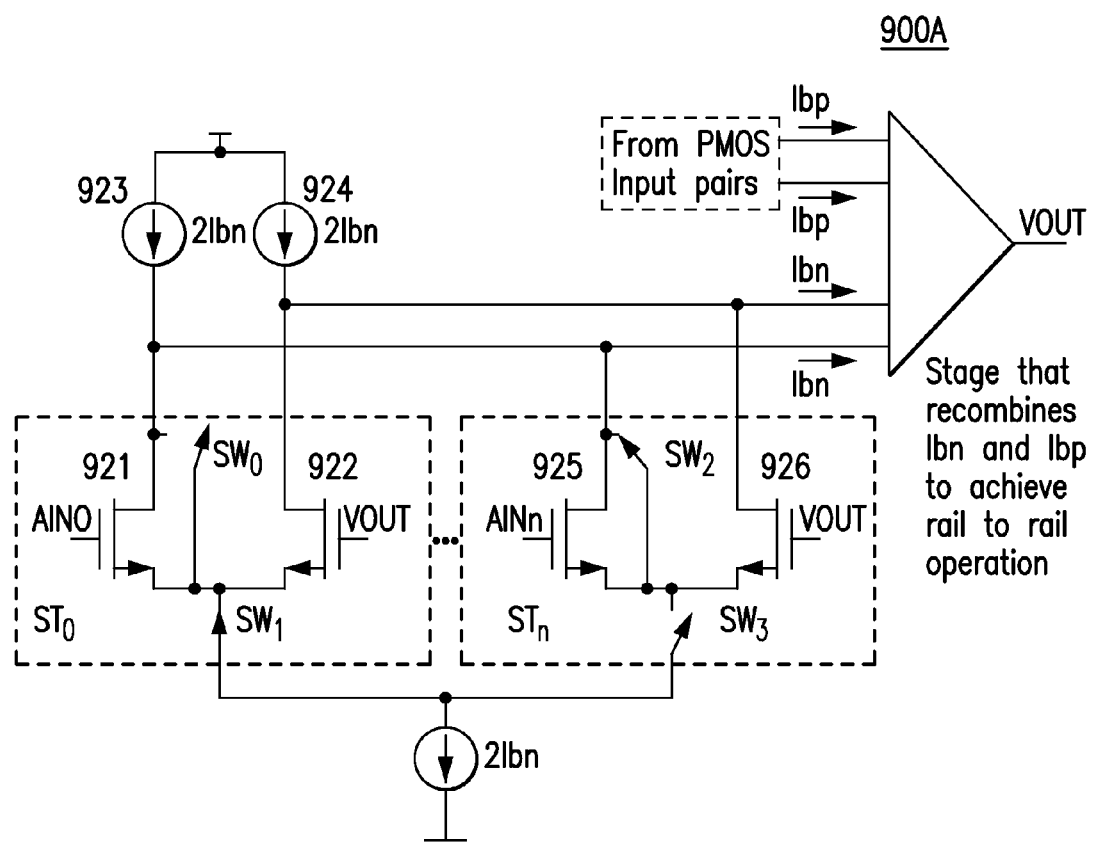
FIGS. 9(a) and 9(b) are circuit diagrams of other pre-charge buffers 900A and 900B according to embodiments of the present invention.
Figure 9B:
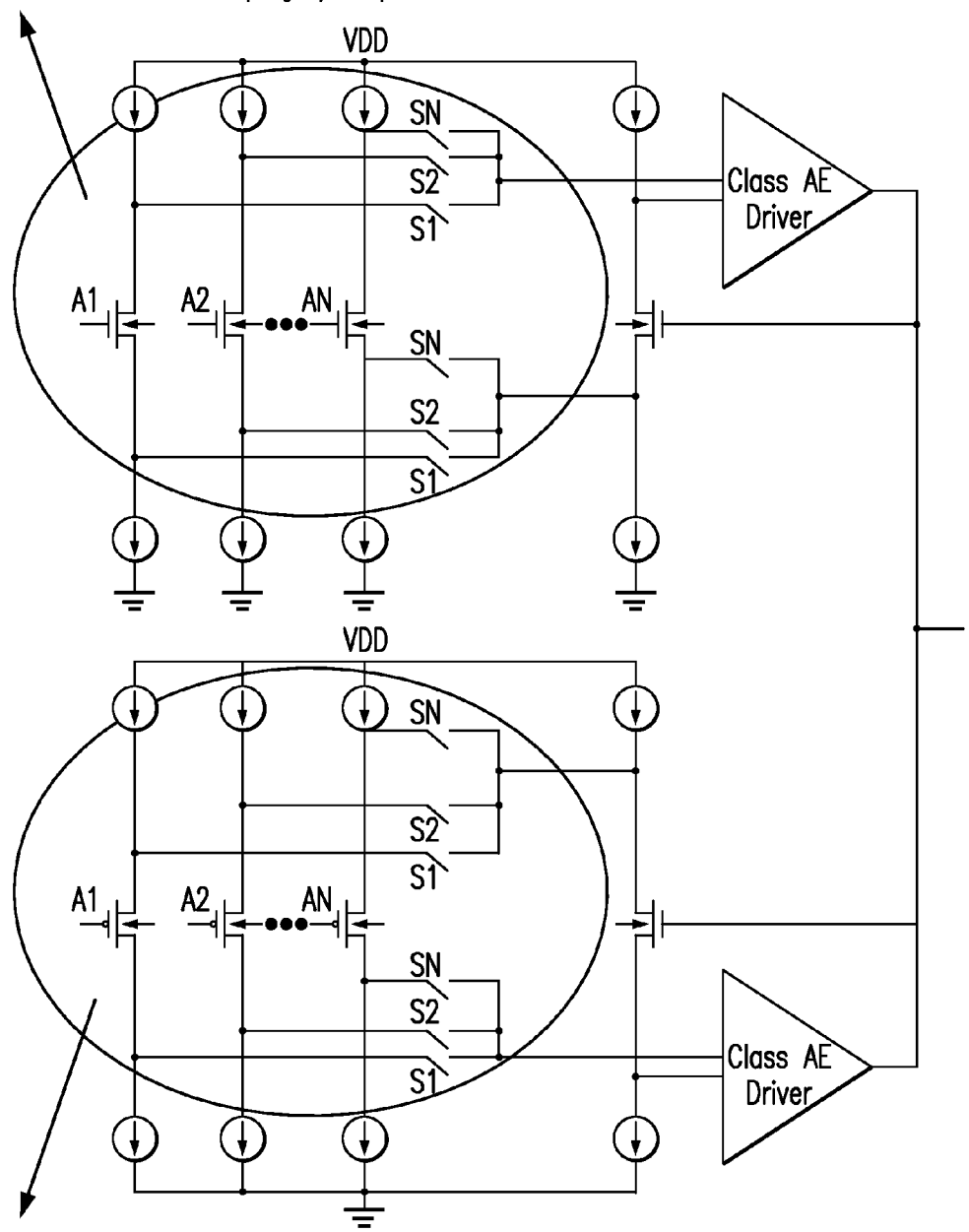

FIGS. 9(a) and 9(b) are circuit diagrams of pre-charge buffers 900A and 9008 according to embodiments of the present invention. FIGS. 9(a) and 9(b) depict NMOS input pair schemes that can drive a next stage and that recombine the NMOS and PMOS input pair currents to achieve rail-to-rail operation. Although FIG. 9(a) and FIG. 9(b) depict different implementations, the same rail-to-rail operation is achieved.

As shown in FIG. 9(a), the example pre-charge buffer 900A may include a plurality of PMOS and/or NMOS transmission gates 921 and 922 and a plurality of current sources 923 and 924.

In particular, FIG. 9(a) illustrates a group of input stages $ST_0$-$ST_n$, each input stage having a plurality of transistors 921 and 922 (or 925 and 926), each of the transistors 921 and 922 being supplied by one of the plurality of current sources 923 and 924. Corresponding P-type input stages can also be used, and are the flipped version of the N-type input stages.

In order to achieve rail-to-rail input operation, the pre-charge buffer 900(A or B) may have a combination of N-type and P-type input pairs. For most of the input voltage range, both N-type and P-type input pairs are active. But when the input voltage approaches the rails, one of the input pairs will turn off (i.e., PMOS when input voltage close to $V_{DD}$ and NMOS when close to $V_{SS}$) and the other will stay active such that the pre-charge buffer 900(A or B) can operate over the full input range.

The example pre-charge buffers 900A and 900B have different input stages for each input channel. When the pre-charge buffer 900(A or B) is active, only the input stages of the selected input channel are active. A set of switches $SW_1$ and $SW_3$ provide the bias currents only to the input stages that are active. Another set of switches SW$_0$ and SW$_2$ connect the sources of the input pair devices that are not selected to a low impedance node so as to avoid floating nodes.

Figure 10:
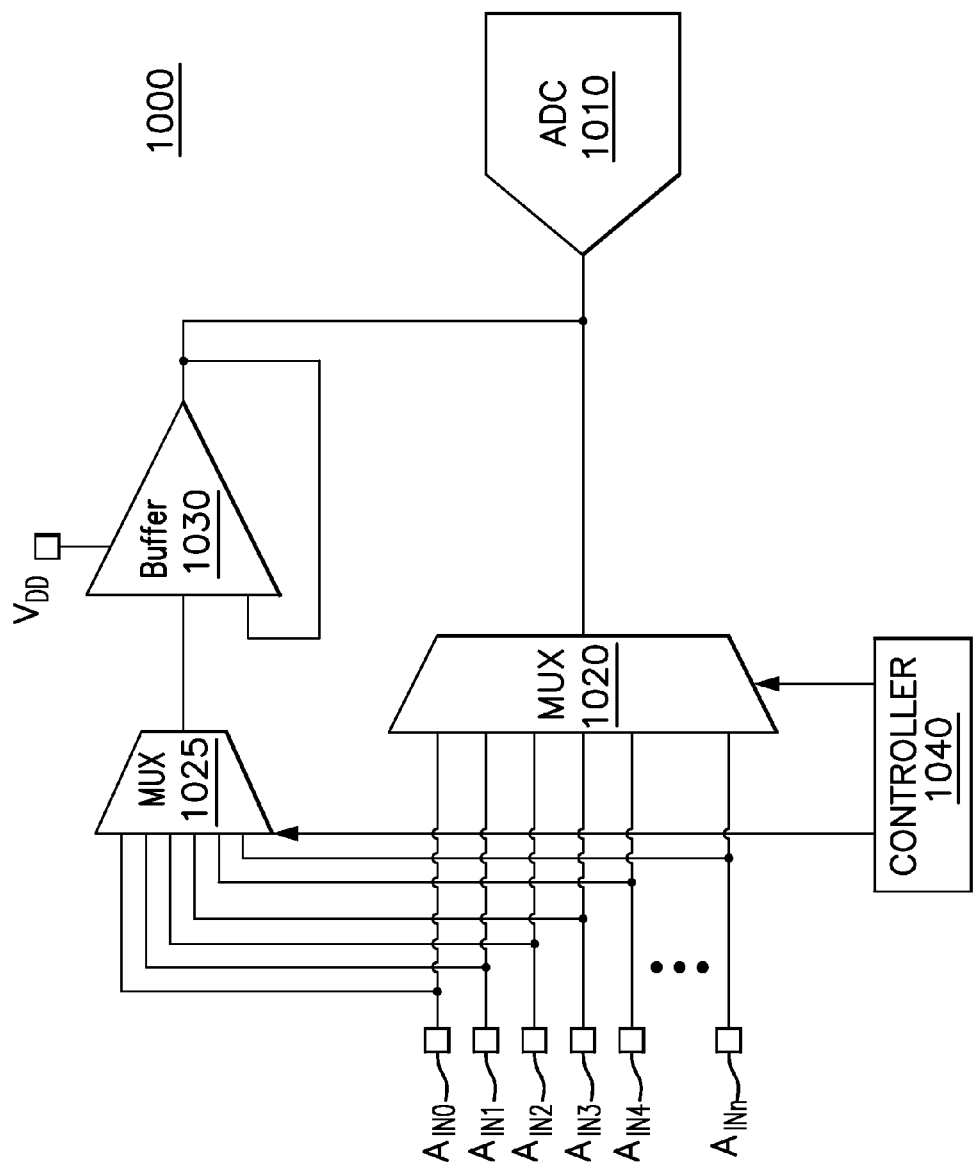
FIG. 10 illustrates a multichannel conversion system according to another example embodiment of the present invention.

FIG. 10 illustrates a multichannel conversion system 1000 according to another embodiment of the present invention. The conversion system 1000 may include an ADC 1010, a first multiplexer 1020, a second multiplexer 1025, a pre-charge buffer 1030, and a controller 1040. The conversion system 1000 may be coupled to a plurality of input channels. Although not shown, the ADC 1010 may be coupled to additional circuitry at its output, such as a digital signal processor.

As shown in FIG. 10, the first and second multiplexers 1020 and 1025 may have a plurality of inputs, each coupled to a respective input channel A$_{IN0}$ to A$_{INn}$. The first multiplexer 1020 may have an output coupled to an input of the ADC 1010. The second multiplexer 1025 may have an output coupled to an input of the pre-charge buffer 1030, such that the pre-charge buffer 1030 is coupled to a respective input channel A$_{IN0}$ to A$_{INn}$. In addition, the pre-charge buffer 1030 may also include an input for a feedback signal. The output of the pre-charge buffer 1030 can be coupled to the output of the multiplexer 1020. The first and second multiplexer 1020 and 1025 may have control inputs coupled to the controller 1040. The controller 1040 may control operation of the multiplexer first and second multiplexer 1020 and 1025 according a protocol and timing scheme provided, for example, by a driving clock (not shown).

During operation, the converter system 1000 may propagate input signals from the channels A$_{IN0}$ to A$_{INn}$ to the ADC 1010 on a cyclical basis. On each cycle, the converter system 1000 may operate in a precharge phase and a signal driving phase. During the precharge phase, the pre-charge buffer 1030 may output a voltage to the input of the ADC 1010 based on a voltage present at an associated input channel (e.g., channel A$_{IN1}$). During the signal driving phase, the pre-charge buffer 1030 may be disabled and the first multiplexer 1020 may propagate a signal from the input channel A$_{IN1}$ to the ADC 1010. Thereafter, the converter system 1000 may advance to another channel (e.g., A$_{IN2}$) for another cycle of operation.

As shown in FIG. 10, the pre-charge buffer 1030 of conversion system 1000 may include a feedback loop. The amplifier feedback can be used to improve amplifier performance including gain stability, frequency response, and linearity. In addition, deviances caused by manufacturing variations and operating conditions can be reduced. In the embodiment of FIG. 10, pre-charge buffer 1030 may have a single input for the feedback signal.

Although second multiplexer 1025 is depicted separately from pre-charge buffer 1030, second multiplexer 1025 may be incorporated into pre-charge buffer 1030 in some instances. Compared to the first multiplexer 1020, the second multiplexer 1025 may be smaller and have less capacitance. In addition, the load on the output of the second multiplexer 1025 may be smaller than the output of first multiplexer 1020.

Figure 11:
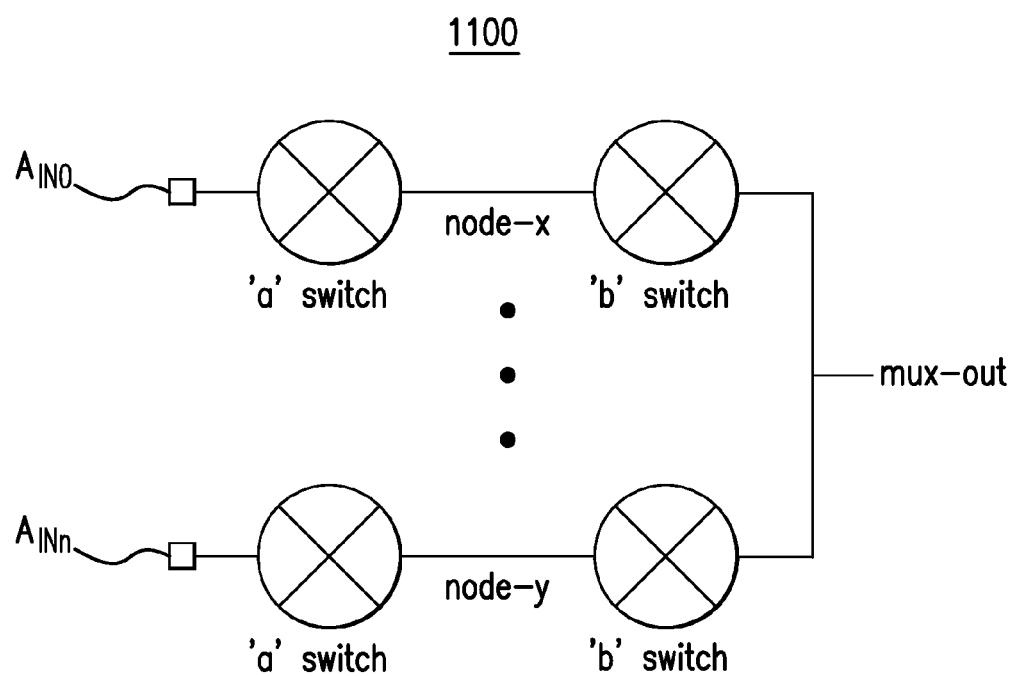
FIG. 11 illustrates an example multiplexer unit 1100 according to an example embodiment of the present invention.

FIG. 11 illustrates an example multiplexer 1100 that includes a plurality of switches in series such that the pre-charge buffer precharges each node before the first series switch (i.e., a switch connected to an input channel) closes. Here, switch B is turned on before switch A so that node X is pre-charged by pre-charge buffer.

Using the embodiments of the present invention, residual input current can be significantly reduced. Some implementations demonstrate an input current decrease from 1.1 uA to 55 nA.

While specific implementations and hardware/software configurations for the multichannel switching systems have been illustrated, it should be noted that other implementations and hardware/software configurations are possible and that no specific implementation or hardware/software configuration is needed. Thus, not all of the components illustrated may be needed for the device implementing the methods disclosed herein.

It will be apparent to those skilled in the art that various modifications and variations can be made in the input current cancellation scheme for fast channel switching systems of the present invention without departing from the spirit or scope of the invention. Thus, it is intended that the present invention cover the modifications and variations of this invention provided they come within the scope of the appended claims and their equivalents.

We claim:
1. A multichannel system, comprising:
a multiplexer having inputs for a plurality of analog input channels; and
a pre-charge buffer having a plurality of inputs coupled to the plurality of analog input channels, and an output coupled to a multiplexer output, wherein the pre-charge buffer is configured to pre-charge the multiplexer output to an analog input voltage of an analog input channel prior to the multiplexer switching to the analog input channel.

2. The multichannel system according to claim 1, wherein the pre-charge buffer charges the multiplexer output to a next channel input voltage during an interstitial phase between successive multiplexer connections.

3. The multichannel system according to claim 2, wherein the multiplexer output is charged before the multiplexer switches to the next channel.

4. The multichannel system according to claim 1, wherein each of the plurality of analog input channels is multiplexed sequentially.

5. The multichannel system according to claim 1, wherein each of plurality of analog input channels is multiplexed in a predetermined order.

6. The multichannel system according to claim 1, wherein the pre-charge buffer is an operational amplifier.

7. The multichannel system according to claim 1, wherein the pre-charge buffer is an operational trans-conductance amplifier.

8. The multichannel system according to claim 1, further comprising a receiving circuit having an input coupled to the multiplexer output.

9. The multichannel system according to claim 8, wherein the receiving circuit is an analog to digital converter.

10. The multichannel system according to claim 8, further comprising an amplifier disposed between the multiplexer output and an input of the receiving circuit.

11. The multichannel system according to claim 10, wherein the amplifier is a unity gain amplifier.

12. The multichannel system according to claim 10, wherein the amplifier is a programmable gain amplifier.

13. The multichannel system according to claim 1, further comprising a second multiplexer disposed between the plurality of input channels and the pre-charge buffer.

14. A method for operating a multichannel system, comprising:

receiving, at a multiplexer, a plurality of analog inputs from a plurality of analog input channels; and pre-charging an output of the multiplexer to an analog input voltage of an analog channel input channel prior to the multiplexer switching to the analog input channel using a pre-charge buffer circuit.

15. The method according to claim 14, wherein the pre-charge buffer charges the multiplexer output to a next channel input voltage during an interstitial phase between successive multiplexer connections.

16. The method according to claim 15, wherein the multiplexer output is charged before the multiplexer switches to the next channel.

17. The method according to claim 14, wherein each of the plurality of analog input channels is multiplexed sequentially.

18. The method according to claim 14, wherein each of the plurality of analog input channels is multiplexed in a predetermined order.

19. The method according to claim 14, wherein the pre-charge buffer is an operational amplifier.

20. The method according to claim 14, wherein the pre-charge buffer is an operational trans-conductance amplifier.

21. The method according to claim 14, wherein the output of the multiplexer is coupled to a receiving circuit.

22. The method according to claim 21, wherein the receiving circuit is an analog to digital converter.

23. The method according to claim 21, wherein an amplifier is disposed between the output of the multiplexer and an input of the receiving circuit.

24. The method according to claim 23, wherein the amplifier is a unity gain amplifier.

25. The method according to claim 23, wherein the amplifier is a programmable gain amplifier.

26. The method according to claim 14, wherein a second multiplexer is disposed between the plurality of input channels and the pre-charge buffer.

\* \* \* \* \*